US009606779B2

(12) United States Patent
Yoon et al.

(10) Patent No.: US 9,606,779 B2
(45) Date of Patent: Mar. 28, 2017

(54) DATA PROCESSING SYSTEM AND DATA SIMULATION METHOD IN THE SYSTEM

(71) Applicant: Samsung Electronics Co., Ltd., Gyeonggi-do (KR)

(72) Inventors: Ui Son Yoon, Gyeonggi-do (KR); Bum Sik Kim, Chungcheongnam-do (KR); Kyoung Soo Cho, Seoul (KR); Ji Joong Moon, Gyeonggi-do (KR)

(73) Assignee: SAMSUNG ELECTRONICS CO., LTD, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/376,129

(22) PCT Filed: Jan. 30, 2013

(86) PCT No.: PCT/KR2013/000757
§ 371 (c)(1),
(2) Date: Jul. 31, 2014

(87) PCT Pub. No.: WO2013/115561
PCT Pub. Date: Aug. 8, 2013

(65) Prior Publication Data
US 2014/0372992 A1    Dec. 18, 2014

(30) Foreign Application Priority Data
Jan. 31, 2012    (KR) .................. 10-2012-0009426

(51) Int. Cl.
*G06F 9/44*    (2006.01)
*G06F 9/45*    (2006.01)
(Continued)

(52) U.S. Cl.
CPC ............... *G06F 8/41* (2013.01); *G06F 8/447* (2013.01); *G06F 8/4441* (2013.01); *G06F 8/51* (2013.01);
(Continued)

(58) Field of Classification Search
None
See application file for complete search history.

(56) References Cited

U.S. PATENT DOCUMENTS 5,313,614 A * 5/1994 Goettelmann ............ G06F 8/52
717/138
6,751,583 B1 * 6/2004 Clarke ................ G06F 17/5022
703/17
(Continued)

FOREIGN PATENT DOCUMENTS

| KR | 10-0323372 | 2/2002 |
| KR | 10-2007-0088818 | 8/2007 |
| KR | 10-0938489 | 1/2010 |

OTHER PUBLICATIONS

Hammond et al., Title: WARPP—"A Toolkit for Simulating High-Performance Parallel Scientific Codes" Copyright 2009 ACM 978-963-9799-45-5.*

(Continued)

Primary Examiner — Wei Zhen
Assistant Examiner — Hossain Morshed

(57) ABSTRACT

The present invention relates to a data processing system and to a method for implementing simulation in the system, and the invention comprises: a process of inputting an application code for implementing a simulation; a process of converting the input application code into assembly data format; a process of generating basic blocks for the assembly data format; and a process of implementing the simulation via the generated basic blocks. Consequently the simulation implementation time is shortened as the simulation is implemented from instruction units to basic block units.

20 Claims, 3 Drawing Sheets

(51) Int. Cl.
*G06F 17/50* (2006.01)
*G06F 9/455* (2006.01)

(52) U.S. Cl.
CPC ............... *G06F 8/53* (2013.01); *G06F 9/455* (2013.01); *G06F 17/5009* (2013.01)

(56) References Cited

U.S. PATENT DOCUMENTS

| | | | | |
|---|---|---|---|---|
| 7,080,365 | B2* | 7/2006 | Broughton | G06F 8/427 703/15 |
| 7,702,499 | B1* | 4/2010 | Lavagno | G06F 11/3457 703/27 |
| 7,844,928 | B2* | 11/2010 | Bell | G06F 17/5022 716/133 |
| 8,489,382 | B1* | 7/2013 | Koh | G06F 8/30 703/20 |
| 2005/0193184 | A1* | 9/2005 | Kohno | G06F 17/5045 712/1 |
| 2006/0129259 | A1* | 6/2006 | Tornquist | G05B 19/4097 700/98 |
| 2007/0226703 | A1* | 9/2007 | Sharapov | G06F 12/0862 717/131 |
| 2009/0276191 | A1* | 11/2009 | Bell, Jr. | G01R 31/318357 703/1 |
| 2009/0319986 | A1* | 12/2009 | Khan | G06F 8/51 717/106 |
| 2012/0144380 | A1* | 6/2012 | Rabeler | G06F 8/68 717/170 |
| 2012/0197625 | A1* | 8/2012 | Wang | G06F 9/485 703/22 |
| 2013/0096903 | A1* | 4/2013 | Kuwamura | G06F 8/52 703/19 |
| 2014/0372992 | A1* | 12/2014 | Yoon | G06F 8/447 717/137 |

OTHER PUBLICATIONS

International Search Report dated May 30, 2013 in connection with International Patent Application No. PCT/KR2013/000757, 5 pages.
Written Opinion of International Searching Authority dated May 30, 2013 in connection with International Patent Application No. PCT/KR2013/000757, 4 pages.

* cited by examiner

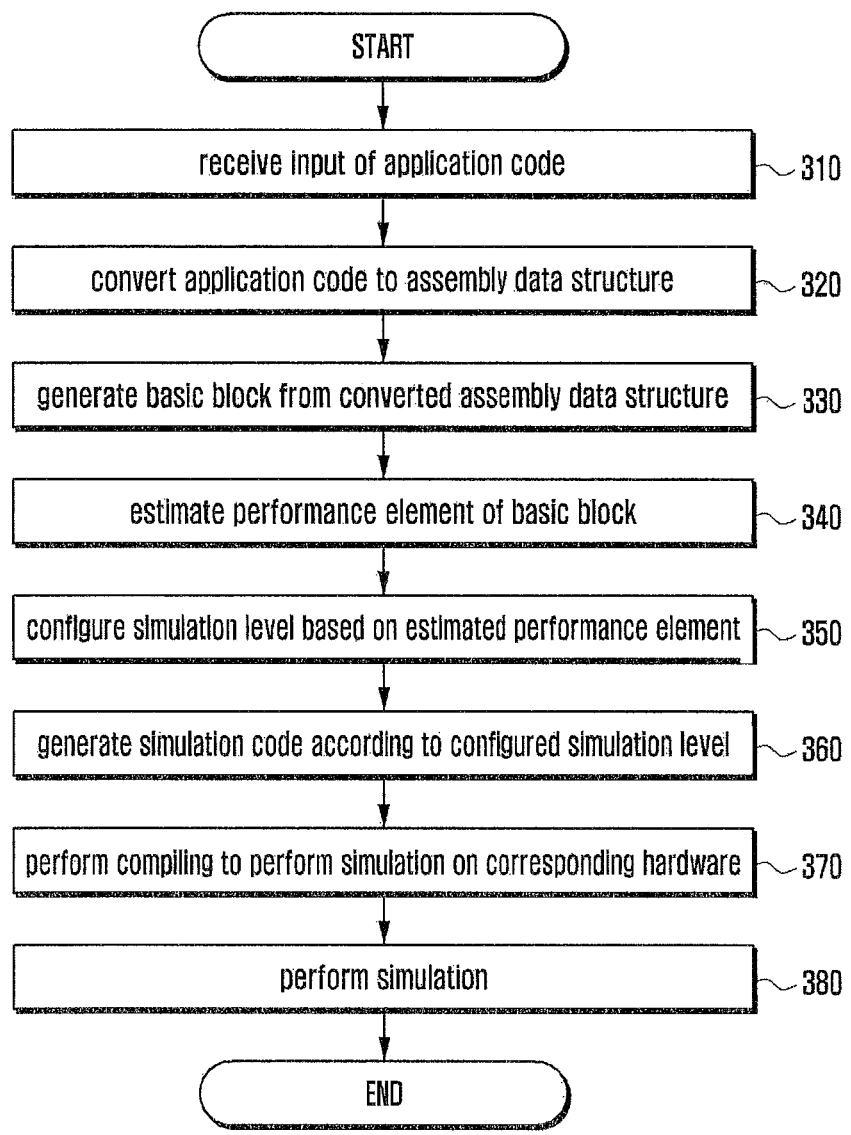

DATA PROCESSING SYSTEM AND DATA SIMULATION METHOD IN THE SYSTEM

CROSS-REFERENCE TO RELATED APPLICATION(S)

The present application claims priority under 35 U.S.C. §365 to International Patent Application No. PCT/KR2013/000757 filed Jan. 30, 2013, entitled "DATA PROCESSING SYSTEM AND DATA SIMULATION METHOD IN THE SYSTEM". International Patent Application No. PCT/KR2013/000757 claims priority under 35 U.S.C. §365 and/or 35 U.S.C. §119(a) to Korean Patent Application No. 10-2012-0009426 filed Jan. 31, 2012, and which are incorporated herein by reference into the present disclosure as if fully set forth herein.

TECHNICAL FIELD

The present invention relates to a data processing system and data simulation method thereof and, in particular, to a method of estimating software performance on a specific CPU for efficient CPU utilization in a Heterogeneous Multi/Many Core environment having various computing resources.

BACKGROUND ART

Typically, in order for a software application selected by a user to run on a hardware platform, it is necessary to perform a compile process. The software performance on a certain CPU is estimated through simulation for efficient CPU utilization. In order to accomplish this, if an assembly code targeting the corresponding CPU is received, this code is converted to a Host Assembly-level C code feasible for simulation.

In more detail, the C code to be measured is first compiled into an assembly code by means of a target compiler. Next, a translator translates the compiled assembly code to a C code feasible for simulation. The simulation C code is compiled to a simulation object file using the host compiler. Finally, a simulation file executable in link with other object files generated through the above procedure and libraries for simulation is generated.

The translator converts the assembly code to a main data structure and performs multiple operations centered around the data structure. Such operations include WORD EXPANSION, DEPENDENCY RESOLUTION, SYMBOL EXTRACTION, etc.

The WORD EXPANSION is an operation for expanding/shrinking the corresponding assembly instruction depending on the TARGET CPU. The DEPENDENCY RESOLUTION is an operation for analyzing dependency relationship of H/W resource necessary and inserting time information to execute the assembly instruction. The SYMBOL EXTRACTION is an operation for extracting symbol information such as function name, global variable, static variable, and assembly label to generate a SYMBOL TABLE. The ELEMENTARY SIMULATION MODEL GENERATION, SIMULATION ASSEMBLY, and SIMULATION EXPORT are operations for generating the host simulation C codes by assemble instruction based on the information generated as above.

DISCLOSURE OF INVENTION

Technical Problem

If the simulation is performed through all these processes, the execution time elongates so far. This means that the simulation performed by assembly instruction causes a problem of elongating the execution time.

In this respect, the present invention proposes a data processing system and data simulation method thereof.

Solution to Problem

In accordance with an aspect of the present invention, a data simulation method of a data processing system includes receiving input of an application code to be simulated, converting the input application code to an assembly data structure, generating a basic block from the assembly data structure, and performing simulation on the basic block.

Preferably, generating the basic block includes configuring a simulation level by estimating a performance element of the basic block and generating a simulation code according to the configured simulation level.

Preferably, generating the basic block includes configuring the simulation level depending on simulation purpose.

Preferably, generating the basic block includes searching for entry and exit points for generating the basic blocks from the assembly data structure and generating the basic block by grouping assembly data structures having the same entry and exit points among the found entry and exit points.

In accordance with another aspect of the present invention, a data simulation system includes a target compile system which receive input of an application code to which simulation is performed, a performance estimation code generation system which converts the input application code to an assembly data structure and generates a basic block from the assembly data structure, and a host compile system which performs simulation on the basic block.

Preferably, the performance estimation code generation system configures a simulation level by estimating a performance element of the basic block and generates a simulation code according to the configured simulation level.

Preferably, the performance estimation code generation system configures the simulation level depending on simulation purpose.

Preferably, the performance estimation code generation system searches for entry and exit points for generating the basic blocks from the assembly data structure and generates the basic block by grouping assembly data structures having the same entry and exit points among the found entry and exit points.

Advantageous Effects of Invention

The data processing system and data simulation method of the present invention are advantageous in terms of reducing the simulation execution time by performing the simulation by basic block in the stead of instruction. Also, the data processing system and data simulation method of the present invention are advantageous in terms of reducing the simulation execution time by performing the simulation by basic block as compared to the simulation performed by instruction. Furthermore, the data processing system and data simulation method of the present invention is advantageous in terms of reducing the simulation execution time by generating a simulation code selectively depending on a level of simulation to be performed by basic block.

BRIEF DESCRIPTION OF DRAWINGS

FIG. 3 is a flowchart illustrating the data simulation method according to an embodiment of the present invention.

MODE FOR THE INVENTION

The term 'data processing system' denotes an information processing apparatus capable of generating data and processing incoming and outgoing data. Here, examples of the data processing system include desktop computer, laptop computer, tablet PC, portable terminal, and smartphone that have at least one processing device, e.g. Central Processing Unit and Graphic Processing Unit.

The term 'compiler' or 'compile' denotes a program or process of converting an application programmed with a high-level language to a target application equivalent in meaning and executable by a terminal immediately. That is, in order to execute a certain application, it is necessary to convert the application into the language which the terminal can understand. The program responsible for such a task is the compiler.

The application input to be compiled is referred to as native application, and the language used for writing the native application is referred to as source code. The compiled application is referred to as a target application, and the language of the target application is referred to as object language or target language. If an application is compiled into a target application, the application may be executed repeatedly as long as the native application is not modified.

The term 'Central Processing Unit (CPU)' denotes a device for processing overall data at the center of the terminal and responsible for interpreting and executing commands input by the user and outputting the execution result. The basic role of the CPU is to perform operation/calculation tasks.

The term 'Graphics Processing Unit (GPU)' denotes a device responsible for processing graphics including 3D graphics. When a terminal equipped with a GPU performs graphic-related operations, it may alleviate the load of the CPU. The GPU also may process a large amount of matrices and vectors and execute the applications requiring such operations frequently.

The operation principle of the present invention is described hereinafter with reference to accompanying drawings. Detailed descriptions of well-known functions and structures incorporated herein may be omitted to avoid obscuring the subject matter of the present disclosure. Further, the following terms are defined in consideration of the functionality in the present disclosure, and may vary according to the intention of a user or an operator, usage, and so forth. Therefore, the definitions should be understood on the basis of the overall content of the present specification.

Figure 1:
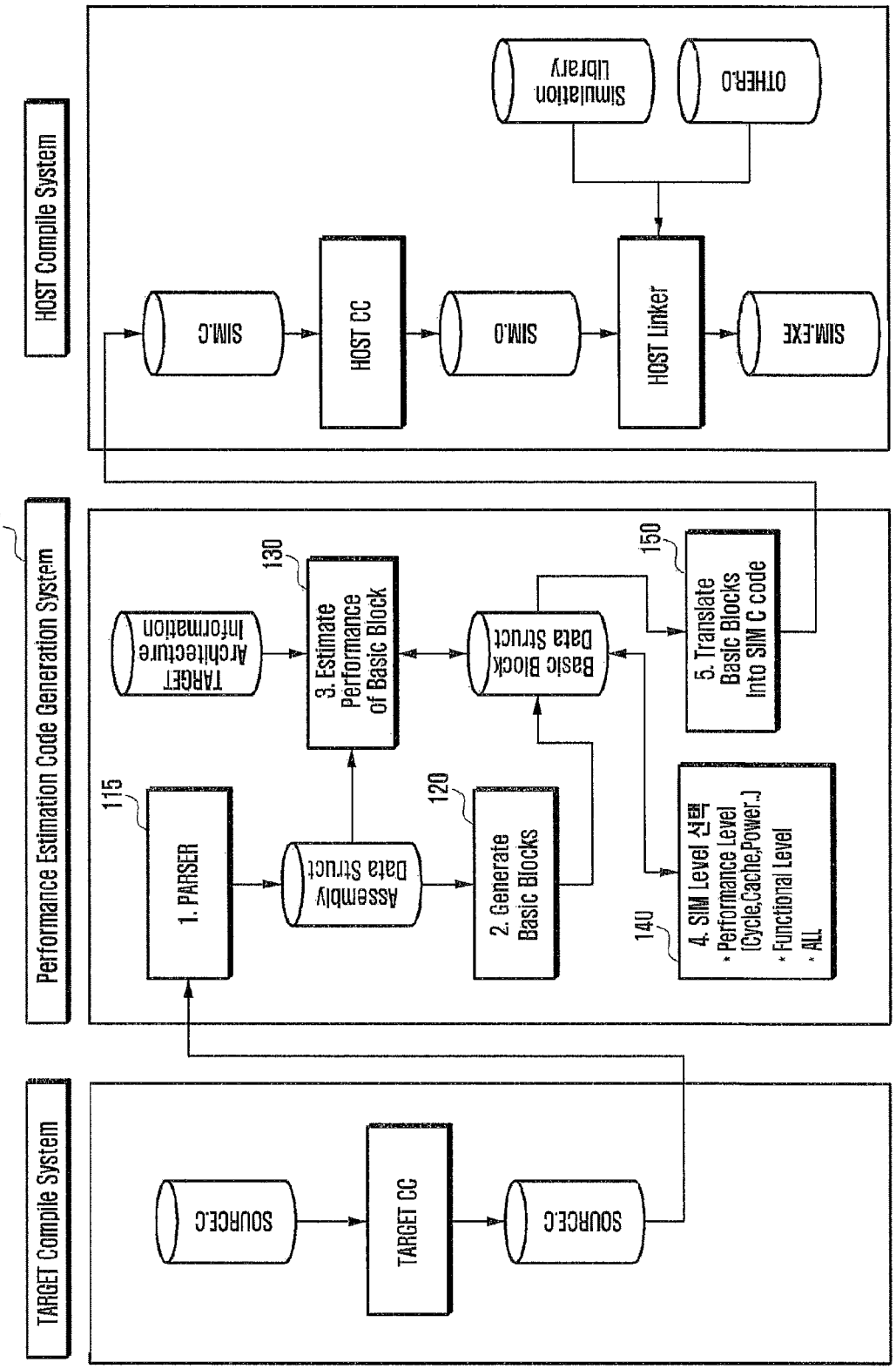
FIG. 1 is a block diagram illustrating a data processing system according to an embodiment of the present invention.

FIG. 1 is a block diagram illustrating a data processing system according to an embodiment of the present invention.

Referring to FIG. 1, the data processing system includes a target compile system, a performance estimation code generation system 110, and a host compile system.

The target compile system is responsible for converting a S/W code for performance estimation to a target assembly code. That is, the target compile system generates an assembly code for use in generating the simulation code using the C code by means of a compiler suitable for the CPU or GPU as the hardware on which the software is running. At this time, the compiler may be the compiler for use in development, e.g. GNU Compiler Collection (GCC).

The performance estimation code generation system 110 is responsible for generating a simulation C code with the input of the assembly code generated by the target compile system. In order to accomplish this, the performance estimation code generation system 110 includes a parser 115, a basic block generator (Generate Basic Block) 120, a basic block performance estimator (Estimate Performance of basic block) 130, a Sim level selector 140, and a basic block translator (Translate Basic Blocks into SIM C code) 150.

The parser 115 reads the assembly file processed by the target compile system and converts the assembly file to an assembly data structure which the system can understand.

The basic block generator 120 searches for entry and exit points for generating a basic block in the assembly data structure converted by the parser 115. The basic block generator 120 also groups the assembly data instructions having the same entry and exit points, among the found entry and exit points, into a basic block. Here, the entry point may be any of a start point of a function, assembly instruction point following a label or branch command, and a point corresponding to a destination address of the branch command. The exit point may be any of a branch command point, a return point, and a program counter register manipulation point.

The basic block performance estimator 130 estimates the performance of the corresponding assembly instruction as an element predictable per basic block generated by the basic block generator 120. At this time, the predictable elements include cycles and power, and the options selectable in measuring performance include CPU execution cycles, cache hit/miss count, and power consumption. The basic block performance estimator 130 calculates the resource necessary for executing instruction per basic block. The basic block performance estimator 130 also stores the calculated resource in the Performance_T field of the basic block.

The Sim level selector 140 may configure the level of the simulation through code analysis. The options selectable during the simulation may include Control-Only option for executing simulation on only the assembly instructions influencing the branch, Cache-Effect option for executing simulation on only the assembly instructions influencing the memory access address calculation for measurement of cache hit/miss count, and ALL option for executing all assembly instructions to make it perfect functionally. The Control-Only option is the option selected for simulation basically. The Cache-Effect option is the option selected to generate a code for generating an input to the cache model to estimate the cache effect in reading/writing the memory. A method of configuring the simulation level is described with reference to FIG. 2.

The basic block translator 150 translates the previously generated basic block to generate the simulation C code (SIM C code) as shown in table 1.

TABLE 1

| | | |
|---|---|---|
| | | // Performance |
| | | cycles += curBB.perf.cycles; |
| | | power += curBB.perf.power; |
| ldr r3, [sp, #4] | | |
| add r0, r1, r2 | | |
| | | // Functionality |
| mul r2, r0, r1 | | |
| | → | r3 = sp[4]; |
| sub r0, r0, r1 | | |

TABLE 1-continued

```
cmp r2, r3
                     r2 = r0 * r1;
beq .L4
                     if(r2 = = r3)
                             goto .L4
```

In more detail, the basic block translator 150 translates the functionality of the assembly instruction into a C code according to the simulation level. The basic block translator 150 also generates a performance code whenever the basic block is called.

The host complier system may generate a file executable at the hardware as the host executing the simulation of the C code generated by the simulation code generator. That is, the host compile system compiles and links the generated simulation code, simulation library, and other simulation code to generate an executable simulation file. At this time, the GNU GCC may be an example of the available host complier.

Figure 2:
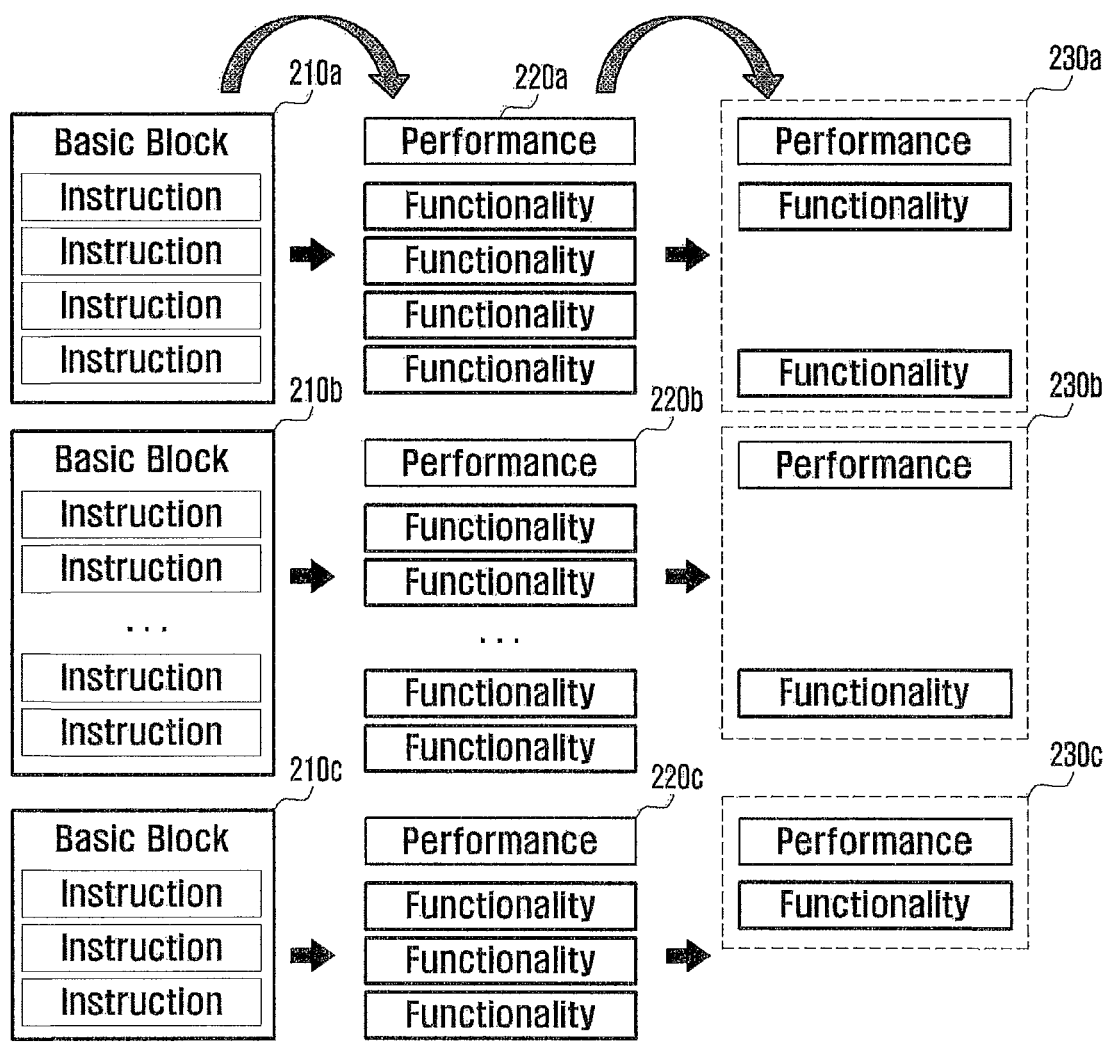
FIG. 2 is a diagram illustrating a procedure of configuring the simulation level using the basic blocks formed according to an embodiment of the present invention.

FIG. 2 is a diagram illustrating a procedure of configuring the simulation level using the basic blocks formed according to an embodiment of the present invention.

Referring to FIG. 2, each of the basic blocks 210*a*, 210*b*, and 210*c* is made up of at least one simulation respectively. One simulation is made up of consecutive codes having entry and exit points. Each of the instructions constituting the basic blocks 210*a*, 210*b*, and 210*c* may be executed sequentially. Accordingly, the basic blocks 210*a*, 210*b*, and 210*c* may be considered as execution units like assembly instructions. The data processing system may perform the basic block simulation as a unit larger than instruction using the basic blocks 210*a*, 210*b*, and 210*c*. The simulation time can be shortened.

Next, a multi-level simulation may be performed through the basic blocks 210*a*, 210*b*, and 210*c*. That is, the simulation may be performed at various levels through code analysis. The performance applied commonly to the instructions constituting the respective basic blocks 210*a*, 210*b*, and 210*c* and the functionalities 220*a*, 220*b*, and 220*c* per instruction are extracted to perform simulation. At this time, the simulation level of the basic block is configured depending on the simulation purpose. The functionality is selected as a result of the code analysis depending on the simulation level among the functionalities 230*a*, 230*b*, and 230*c* extracted per instruction.

In order to select the functionality, the basic blocks are configured with the simulation levels as follows.

Level 1: Simulation is performed only on the branch-related instruction as the most minimal simulation.

Level 2: Simulation is performed only on the memory access address-related instructions to make it possible to estimate performance measurement in consideration of the cache effect.

Level 3: Simulation is performed on the out-related instruction when the target code is used as a call in another source code.

Level 4: Simulation is performed on all functionalities.

For example, if the basic block is configured at level 1, the simulation may be implemented as shown in table 2.

TABLE 2

```
ldr r3, [sp, #4]    ldr r3, [sp, #4]    ldr r3, [sp, #4]
add r0, r1, r2      add r0, r1, r2      add r0, r1, r2
mul r1, r2, r2      mul r1, r2, r2      mul r2, r0, r1
sub r0, r0, r1      sub r0, r0, r1      sub r0, r0, r1
cmp r2, r3          cmp r2, r3          cmp r2, r3
beq .L4             beq .L4             beq .L4
```

The performance estimation code generation system searches for the instruction which generates Condition among the Instructions constituting the basic block configured at level 1. The performance estimation code generation system also searches for the instruction which uses the register used for calculation as target register. Finally, the host compiler system performs simulation using the found instruction.

Furthermore, when performing simulation at the configured level, the instructions corresponding to the dependency used in calculating branch condition for basic CPU execution time estimation may be simulated. In order to take the cache effect into consideration, the memory access address-related instructions may be simulated additionally. All the functions may be implemented as C codes so as to be simulated along with other functions. This makes it possible to reduce the simulation time.

FIG. 3 is a flowchart illustrating the data simulation method according to an embodiment of the present invention.

Referring to FIG. 3, the data processing system receives the input of an application code on which simulation is to be performed at step 310. The data processing system converts the input application code to an assembly data structure at step 320. Next, the data processing system generates a basic block from the converted data structure at step 330. In more detail, the data processing system searches for entry and exit points for generating the basic block from the assembly data structure. Next, the data processing system groups the assembly data instructions having the same entry and exit points, among the found entry and exit points, into a basic block.

The data processing system estimates the performance element of the basic block at step 340. Next, the data processing system configures the simulation level based on the estimated performance element at step 350. At this time, the data processing system extracts the performance applied commonly to the instructions constituting the basic block and the functionality per instruction to perform simulation. The simulation level of the basic block is configured depending on the simulation purpose. The data processing system performs code analysis according to the simulation level of the functionality extracted per instruction and selects the functionality on which simulation is to be performed.

The data processing unit generates a simulation code according to the configured simulation level at step 360. That is, the data processing system converts the selected functionality to a C code. The data processing system writes the performance code whenever the basic block is called. Next, the data processing system processes the converted C code to generate a file executable on the hardware as a host performing the simulation.

The data processing system performs compiling to perform the simulation on the corresponding hardware at step 370. Finally, the data processing system performs the simulation through the corresponding hardware at operation 380.

Since the simulation is performed by basic block in the stead of instruction through the above procedure, it is possible to reduce the simulation execution time. Also, the simulation is performed according to the level configure per basic block so as to reduce the simulation execution time. Also, the simulation code is generated selectively depending on the level of the simulation to be performed per instruction so as to reduce the simulation execution time.

Although the description has been made with reference to particular embodiments, the present invention can be implemented with various modifications without departing from the scope of the present invention. Thus, the present invention is not limited to the particular embodiments disclosed but will include the following claims and their equivalents.

The invention claimed is:

1. A method for data simulation in a data processing system, the method comprising:
   receiving an application code input to be simulated;
   converting the application code input to an assembly data structure;
   generating a basic block by grouping at least one assembly data instruction having the same entry and exit points from the assembly data structure;
   identifying functionalities for the at least one assembly data instruction of the generated basic block;
   identifying a simulation level of the basic block, the simulation level comprises at least a first level for performing a simulation of a branch-related instruction, a second level for performing a simulation of memory access address instruction, and a third level for performing out-related instruction;
   determining at least one functionality among the identified functionalities, based on the simulation level of the basic block; and
   performing a simulation in a unit of the basic block based on the identified simulation level and determined at least one functionality.

2. The method of claim 1, wherein the identifying of the simulation level comprises:
   identifying the simulation level by estimating a performance element of the basic block; and
   generating a simulation code according to the identified simulation level.

3. The method of claim 2, wherein the performance element comprises cycles and powers.

4. The method of claim 2, wherein the performance is a function of at least one of CPU execution cycle, a cache hit count, a cache miss count, or a power consumption.

5. The method of claim 2, wherein the identifying of the simulation level further comprises identifying the simulation level based on a simulation purpose.

6. The method of claim 5, wherein identifying the simulation level further comprises:
   extracting a performance applied commonly to at least one instruction constituting the basic block and functionalities per instruction; and
   selecting a functionality to perform a simulation among the functionalities extracted per instruction.

7. The method of claim 1, wherein generating the basic block comprises:
   searching for entry and exit points to generate the basic blocks from the assembly data structure; and
   generating the basic block by grouping assembly data structures having the same entry and exit points among found entry and exit points.

8. The method of claim 7, wherein the entry points comprise at least one of a start point of a function, an assembly instruction point following a label or branch command, and a point corresponding to a destination address of the branch command.

9. The method of claim 7, wherein the exit points comprise at least one of a branch command point, a return point, and a program counter register manipulation point.

10. The method of claim 1, further comprising storing at least one of the CPU execution cycle, the cache hit count, the cache miss count, or the power consumption in a Performance_T field of the basic block.

11. A processing device to simulate data, the processing device comprising:
   a target compiler configured to receive an application code input to which a simulation is performed;
   a code generation device configured to convert the application code input to an assembly data structure and generate a basic block by grouping at least one assembly data instruction having the same entry and exit points from the assembly data structure identify functionalities for the at least one assembly data instruction and identify a simulation level of the basic block, the simulation level comprises at least a first level for performing a simulation of a branch-related instruction, a second level for performing a simulation of memory access address instruction, and a third level for performing out-related instruction and determine at least one functionality among the identified functionalities, based on the simulation level of the basic block; and
   a host compiler configured to perform a simulation in a unit of the basic block based on the identified simulation level of the basic block and the determined at least one functionality.

12. The processing device of claim 11, wherein the code generation unit is configured to identify the simulation level by estimating a performance element of the basic block and generate a simulation code according to the identified simulation level.

13. The processing device of claim 12, wherein the performance element comprises cycles and powers.

14. The processing device of claim 12, wherein the performance is a function of at least one of CPU execution cycle, a cache hit count, a cache miss count, or a power consumption.

15. The processing device of claim 12, wherein the code generation unit is configured to identify the simulation level as a function of a simulation purpose.

16. The processing device of claim 15, wherein the code generation unit is configured to extract a performance applied commonly to at least one instruction constituting the basic block and functionalities per instruction and select a functionality to perform a simulation among the functionalities extracted per instruction.

17. The processing device of claim 11, wherein the code generation unit is configured to search for entry and exit points to generate the basic blocks from the assembly data structure and generate the basic block by grouping assembly data structures having the same entry and exit points among found entry and exit points.

18. The processing device of claim 17, wherein the entry points comprise at least one of a start point of a function, an assembly instruction point following a label or branch command, and a point corresponding to a destination address of the branch command.

19. The processing device of claim 17, wherein the exit points comprise at least one of a branch command point, a return point, and a program counter register manipulation point.

20. The processing device of claim 11, wherein the code generation device is configured to store at least one of the CPU execution cycle, the cache hit count, the cache miss count, or the power consumption in a Performance$_{13}$ T field of the basic block.

* * * * *